(12) United States Patent
Le et al.

(10) Patent No.: US 6,744,674 B1
(45) Date of Patent: Jun. 1, 2004

(54) CIRCUIT FOR FAST AND ACCURATE MEMORY READ OPERATIONS

(75) Inventors: Binh Quang Le, San Jose, CA (US); Pauling Chen, Saratoga, CA (US); Roger Tsao, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/387,617

(22) Filed: Mar. 13, 2003

(51) Int. Cl.$^7$ .......................... G11C 16/24; G11C 16/26
(52) U.S. Cl. ........................ 365/185.21; 365/185.16; 365/185.18
(58) Field of Search ................ 365/185.21, 185.16, 365/185.18, 185.25

(56) References Cited

U.S. PATENT DOCUMENTS

| | | | | |
|---|---|---|---|---|
| 5,027,321 A | * | 6/1991 | Park ...................... | 365/185.16 |
| 5,959,892 A | * | 9/1999 | Lin et al. ................ | 365/185.28 |
| 6,473,327 B1 | * | 10/2002 | Ishizuka ................... | 365/103 |
| 6,487,124 B2 | * | 11/2002 | Semi ...................... | 365/185.25 |
| 6,510,082 B1 | * | 1/2003 | Le et al. ................. | 365/185.16 |
| 6,532,173 B2 | * | 3/2003 | Iioka et al. ............. | 365/185.16 |

* cited by examiner

*Primary Examiner*—Richard Elms
*Assistant Examiner*—J. H. Hur
(74) *Attorney, Agent, or Firm*—Farjami & Farjami LLP

(57) ABSTRACT

A memory circuit senses current in a target cell during a read operation. According to one exemplary embodiment, the memory circuit comprises the target cell, a first neighboring cell, and an operational amplifier. The first target cell has a first bit line connected to ground; the target cell also has a second bit line connected to a drain voltage. A sensing circuit is coupled at a first node to at least one of the first bit line or the second bit line. The first neighboring cell has a third bit line connected to a second node. The operational amplifier has an output terminal connected at the second node to the third bit line. The operational amplifier has a noninverting input terminal connected to said first node, and also has an inverting input terminal connected to the second node.

20 Claims, 5 Drawing Sheets

CIRCUIT FOR FAST AND ACCURATE MEMORY READ OPERATIONS

TECHNICAL FIELD

The present invention relates generally to the field of semiconductor devices. More particularly, the present invention relates to semiconductor memory devices.

BACKGROUND ART

Memory devices are known in the art for storing data in a wide variety of electronic devices and applications. A typical memory device comprises a number of memory cells. Often, memory cells are arranged in an array format, where a row of memory cells corresponds to a word line and a column of memory cells corresponds to a bit line, and where each memory cell defines a binary bit, i.e., either a zero ("0") bit or a one ("1") bit. For example, a memory cell may be defined as either being a "programmed" cell or an "erased" cell. According to one particular convention, a programmed cell is representative of a "0" bit, and an erased cell is representative of a "1" bit. In one type of memory cell, each cell stores two binary bits, a "left bit" and a "right bit." The left bit can represent a "0" or a "1" while the right bit can represent a "0" or a "1" independent of the left bit.

Typically, the state of a memory cell is determined during a read operation by sensing the current drawn by the memory cell. For example, to ascertain the current drawn by a particular memory cell using drain-side sensing, the drain terminal of the memory cell is connected to a sensing circuit, the source terminal of the memory cell is connected to ground, and the gate of the memory cell is selected. The sensing circuit attempts to detect the current drawn by the memory cell, and compares the sensed memory cell current against a reference current. If the sensed memory cell current exceeds the reference current, the memory cell is considered an erased cell (corresponding to a "1" bit). However, if the sensed memory cell current is below the reference current, the memory cell is considered a programmed cell (corresponding to a "0" bit).

In practice, it is desirable to have the sensed memory cell current be greater than or less than the reference current by a "read margin." In the present application, read margin is defined as the absolute value of the difference between current drawn by a target memory cell and the current drawn by a reference cell during a read operation. With a sufficient read margin, the impact of extraneous factors, such as noise, for example, upon the detection of the memory cell current is greatly reduced. By way of illustration, suppose the reference current used for comparison is fifteen (15) micro-Amps ($\mu A$) in a particular memory device. In this case, in order to provide a read margin of five (5) $\mu A$, it would be desirable to sense a memory cell current of twenty (20) $\mu A$ or greater for an erased cell (corresponding to a "1" bit) and a memory cell current of ten (10) $\mu A$ or less for a programmed cell (corresponding to a "0" bit). With a 5 $\mu A$ read margin, the impact of extraneous factors, such as noise, is significantly reduced.

Conventional memory circuits, however, considerably reduce the read margin for sensing memory cell current during read operations (in the present application, reduction of the read margin is also referred to as "read margin loss"). When the read margin is significantly reduced, the reliability of sensing the memory cell current also decreases, since extraneous factors, such as noise, have a greater impact. The reliability and accuracy of the read operation are thus reduced, resulting in poor performance of the memory device. Accordingly, there exists a strong need in the art to overcome deficiencies of known memory circuits and to provide a memory circuit and technique which results in reduced read margin loss in a fast and accurate manner during memory read operations.

SUMMARY

The present invention is directed to a circuit for fast and accurate memory read operations. The invention addresses and resolves the need in the art for a memory circuit and technique which results in reduced read margin loss in a fast and accurate manner during memory read operations. According to one exemplary embodiment, the memory circuit for sensing current in a target cell during a read operation comprises the target cell, a first neighboring cell, and an operational amplifier. In the exemplary embodiment, the target cell has a first bit line connected to ground, and further has a second bit line connected to a drain voltage. A sensing circuit is coupled at a first node to at least one of the first bit line or the second bit line. For example, in drain-side sensing, the sensing circuit is coupled to the second bit line whereas in source-side sensing, the sensing circuit is coupled to the first bit line. The first neighboring cell has a third bit line connected to a second node. The operational amplifier has an output terminal connected at the second node to the third bit line. The operational amplifier also has a noninverting input terminal connected to said first node, and has an inverting input terminal connected to the second node. Each of the target cell and the first neighboring cell comprises a respective gate terminal connected to a common word line. In some embodiments, the target cell may also store a first bit and a second bit.

According to another exemplary embodiment, the memory circuit further comprises a second neighboring cell and a third neighboring cell. In this particular embodiment, the second neighboring cell has a fourth bit line coupled to the first node, and the second neighboring cell is adjacent to the target cell. The third neighboring cell also has a fifth bit line coupled to the first node. The third neighboring cell is adjacent to the second neighboring cell, and the first neighboring cell is adjacent to the third neighboring cell. According to another exemplary embodiment, the memory circuit further comprises a fourth neighboring cell. In this particular embodiment, the fourth neighboring cell has a sixth bit line coupled to the second node, and the fourth neighboring cell is adjacent to the first neighboring cell. According to yet another exemplary embodiment, the memory circuit further comprises a fifth neighboring cell. In this particular embodiment, the fifth neighboring cell has a seventh bit line coupled to the second node, and the fifth neighboring cell is adjacent to the fourth neighboring cell.

Other features and advantages of the present invention will become more readily apparent to those of ordinary skill in the art after reviewing the following detailed description and accompanying drawings.

DETAILED DESCRIPTION OF THE INVENTION

The present invention is directed to a circuit for fast and accurate memory read operations. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings. In the description that follows, references will be made to one particular convention where a programmed state is representative of a "0" bit, and an erased state is representative of a "1" bit, although the present invention is also suitable for use with alternative conventions.

Figure 1A:
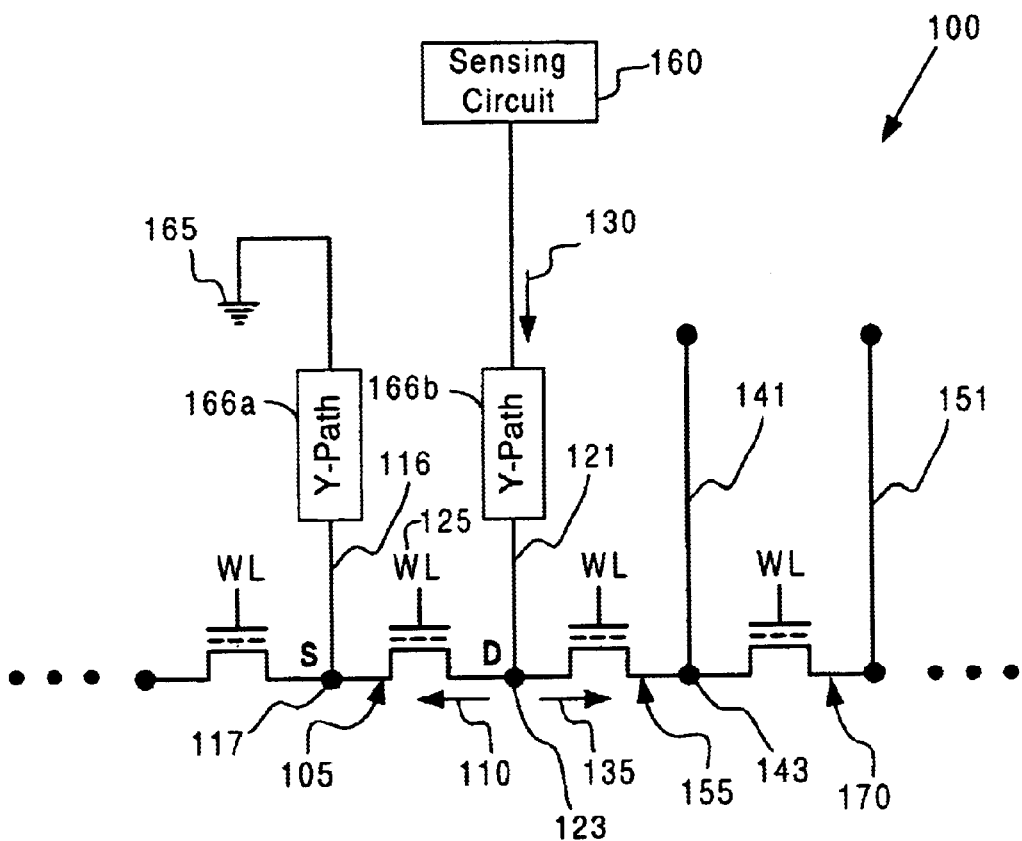
FIG. 1A depicts a circuit diagram of a known memory circuit.
Figure 1B:
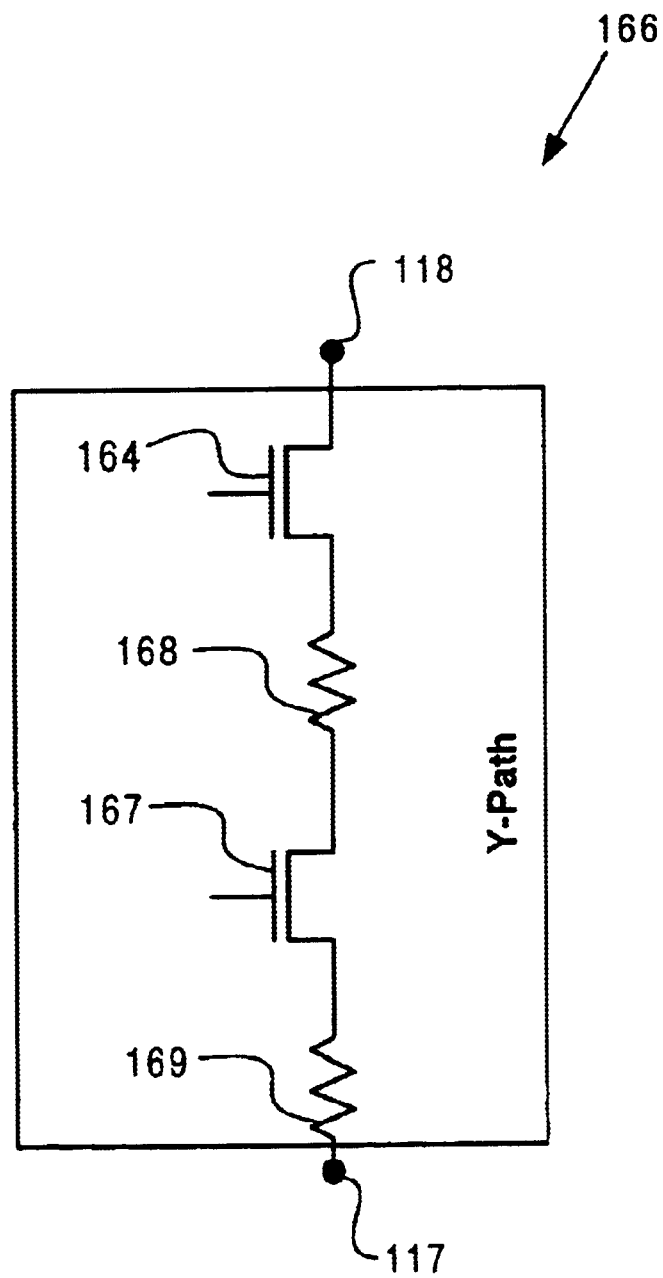
FIG. 1B depicts a simplified Y-decoder or Y-select path, designated as Y-Path.
Figure 2:
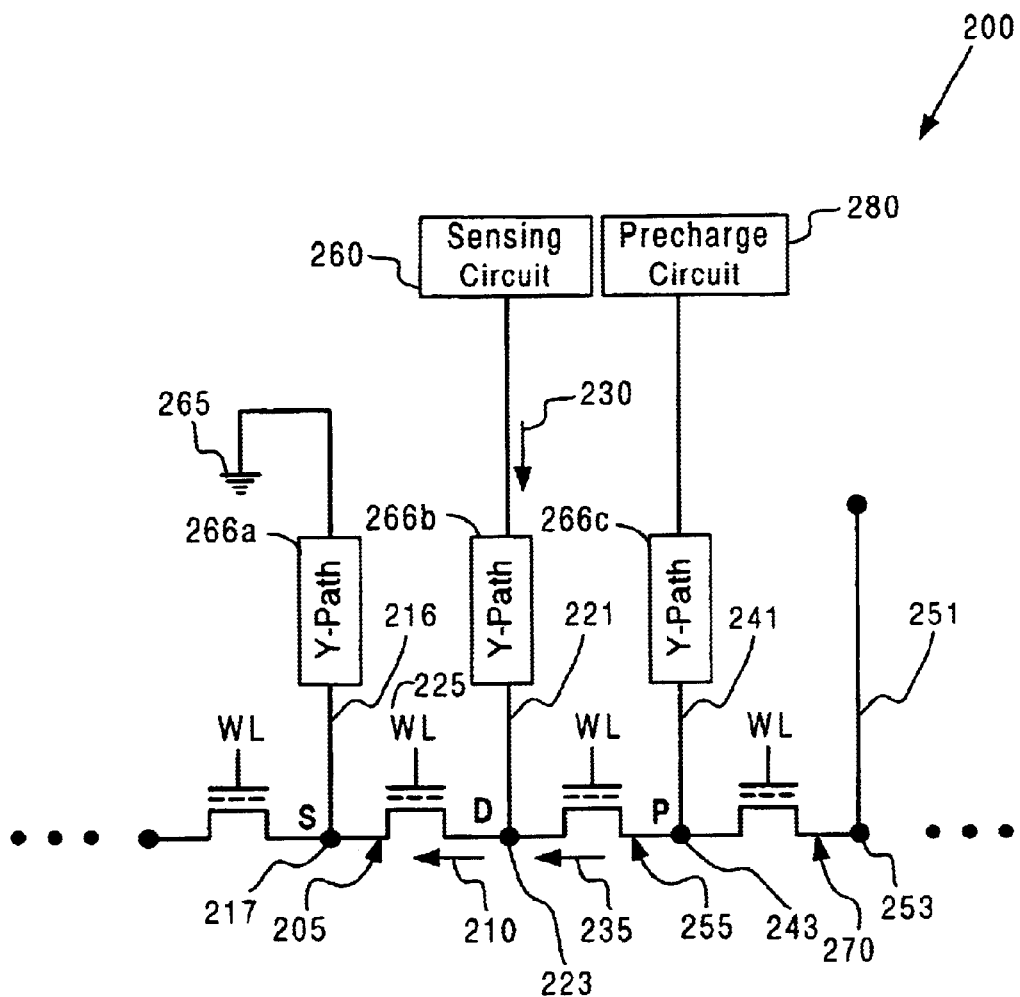
FIG. 2 depicts a circuit diagram of another known memory circuit.

To illustrate the features and advantages of the present invention, a brief description of known memory circuits is provided with reference to FIGS. 1A, 1B and 2. Referring first to FIG. 1A, there is shown known memory circuit 100 corresponding to a portion of a memory device. In circuit 100, bit lines 116 and 121 are connected through a selection circuit, generally shown as Y-Paths 166a and 166b, in a manner so as to sense memory cell current 110 drawn by memory cell 105. This arrangement may be implemented when a read operation involving memory cell 105 is to be performed. Y-Paths 166a and 166b establish connections for bit lines 116 and 121, respectively, in circuit 100 and can, for brevity, be represented by simplified Y-Path 166 as shown in FIG. 1B. FIG. 1B depicts a simplified "Y-decoder" or "Y-select path," referred to simply as "Y-Path" 166. In FIG. 1B, Y-Path 166 provides a connection between node 117 and node 118 through resistor 169, transistor 167, resistor 168, and transistor 164, when both transistors 167 and 164 are activated, e.g., by providing activation signals to respective gates of transistors 167 and 164. Resistors 168 and 169 represent resistance due to global metal bit lines and diffusion bit line.

Continuing with FIG. 1A, bit line 121 is configured as a "drain" bit line (designated "D" in FIG. 1) by connecting node 123 to sensing circuit 160 through Y-Path 166b. Bit line 116 is configured as a "source" bit line (designated "S" in FIG. 1) by connecting node 117 to ground 165 through Y-Path 166a. Bit lines 141 and 151 are "floating" and may have a pattern-dependant path to ground through the neighboring memory cells. Word line 125 (designated "WL" in FIG. 1) is connected to the gate terminal of memory cell 105 and is utilized to activate memory cell 105. When memory cell 105 is activated, the amount of current 110 drawn by memory cell 105 indicates the "programmed" or "erased" status of memory cell 105. By way of illustration, if memory cell 105 is "programmed" (i.e. representing a "0" bit), a low current, for example less 10 μA, is drawn by memory cell 105. Conversely, if memory cell 105 is "erased" (i.e. representing a "1" bit), a high current, for example greater than 20 μA, is drawn by memory cell 105.

With memory circuit 100, sensing circuit 160 senses current 130 in an attempt to ascertain memory cell current 110 through memory cell 105. However, when memory cell 105 is a programmed cell (corresponding to a "0" bit), leakage current 135 from node 123 to node 143 may be drawn when neighboring memory cell 155 and all its neighboring cells between memory cell 155 and ground are erased cells (corresponding to a "1" bit). Also another potential source for leakage current 135 is transient current that could be present for charging some of the bit lines for memory cells situated on the right side of memory cell 155 in FIG. 1A. In this case, current 130 detected by sensing circuit 160 will be the sum of memory cell current 110 and leakage current 135, effectively raising current 130 and reducing the read margin during the read operation when memory cell 105 is a programmed cell. As described above, reducing this read margin during a read operation reduces the reliability of the read operation.

Referring next to FIG. 2, there is shown another known memory circuit 200 corresponding to a portion of a memory device. Similar to memory circuit 100 of FIG. 1, bit line 221 of memory cell 205 is configured as a "drain" bit line (designated "D" in FIG. 2) by connecting node 223 to sensing circuit 260 through Y-Path 266b, while bit line 216 is configured as a "source" bit line (designated "S" in FIG. 2) by connecting node 217 to ground 265 through Y-Path 266a, in a manner so as to sense memory cell current 210 drawn by memory cell 205. Word line 225 (designated "WL" in FIG. 2) is connected to the gate terminal of memory cell 205 and is utilized to activate memory cell 205. When memory cell 205 is activated, the amount of current 210 drawn by memory cell 205 indicates the "programmed" or "erased" status of memory cell 205.

In memory circuit 200, bit line 241 of neighboring cell 255 is configured as a "precharge" bit line (designated "P" in FIG. 2) by connecting node 243 to precharge circuit 280 through Y-Path 266c. Bit line 251 is "floating" and may have a pattern-dependant path to ground through the neighboring memory cells. Y-Paths 266a, 266b and 266c can be represented by Y-Path 166 as shown in FIG. 1B and described above.

Node 243 connected to bit line 241 is supplied a precharge voltage in an effort to reduce leakage current from node 223 to node 243 when memory cell 205 is a programmed cell (corresponding to a "0" bit) and neighboring memory cell 255 is an erased or over-erased cell (corresponding to a "1" bit). For example, precharge circuit 280 attempts to provide at node 243 a voltage at about the same level as that provided at node 223 by sensing circuit 260. In practice, however, the voltages at node 243 and at node 223 vary significantly from each other, even when sensing circuit 260 and precharge circuit 280 are similarly designed. For example, the voltage difference between node 243 and node 223 may be as high as 50 milliVolts (mV). Moreover, the difference in voltages between nodes 243 and 223 cannot be easily controlled and/or compensated for in memory circuit 200 because the difference in voltages at nodes 243 and 223 are due, in large part, to the different magnitude of the currents drawn from sensing circuit 260 and precharge circuit 280, respectively, particularly when memory cell 205 is an erased cell (corresponding to a "1" bit) and memory cell 255 is an erased or over-erased cell and memory cell 270 is a programmed cell. Since the amount of current 210 drawn through memory cell 205 depends on whether memory cell 205 is an erased cell (corresponding to a "1" bit) or a programmed cell (corresponding to a "0" bit), memory circuit 200 is unable to effectively control and compensate for the disparity in the currents drawn from sensing circuit 260 and precharge circuit 280, resulting in a significant voltage difference between nodes 243 and 223. Consequently, leakage current 235 from node 243 to node 223 is drawn through memory cell 255 in the case where memory cell 205 is an erased cell and neighboring memory cell 255 is an erased or over-erased cell and memory cell 270 is a programmed cell. The reason is that when memory cell 205 is an erased cell, memory cell current 210 acts to decrease the voltage supplied at node 223. As a result, the difference in voltages between nodes 243 and 223 acts to draw leakage current 235 from node 243 to node 223 through memory cell 255. In this case, sensing circuit 260 will sense current 230 corresponding to the difference between memory cell current 210 and leakage current 235, effectively reducing current 230 when memory cell 205 is an erased cell and thereby reducing the read margin during a read operation. As pointed out above, reducing this read margin during a read operation reduces the accuracy and reliability of the read operation. By way of example, memory cell current 210 may be approximately 30 $\mu$A when memory cell 205 is an erased cell. However, due to voltage difference between nodes 243 and 223, leakage current 235 through neighboring cell 255 may be about 5 $\mu$A. In this example, current 230 sensed by sensing circuit 260 will be the difference between memory cell current 210 and leakage current 235, and is approximately 25 $\mu$A. When a reference current of 27 $\mu$A (corresponding to a 3 $\mu$A read margin) is used for comparison, leakage current 235 through memory cell 255 reduces the read margin such that the magnitude of sensed current 230 (25 $\mu$A) erroneously indicates that memory cell 205 is a programmed cell when memory cell 205 is actually an erased cell. Such reductions in read margins resulting in erroneous determinations of memory cell status during read operations are intolerable.

Figure 3:
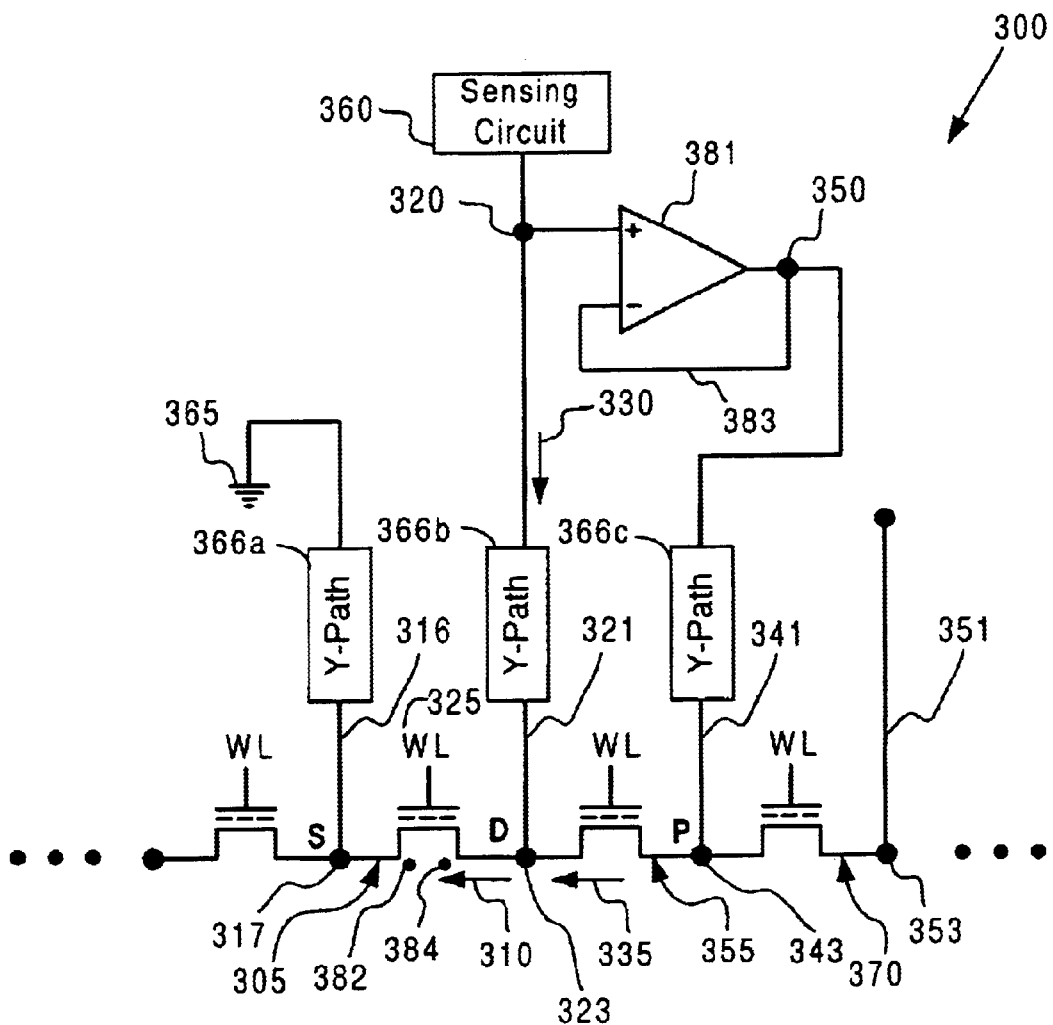
FIG. 3 depicts a circuit diagram of one embodiment of a memory circuit in accordance with the present invention.

Referring now to FIG. 3, there is shown a circuit diagram of memory circuit 300 in accordance with one embodiment of the present invention. As described more fully below, memory circuit 300 results in substantially reduced leakage current and significantly reduced read margin loss during memory read operations. The present invention is suitable for use with memory cells capable of storing two binary bits, a "left" bit and a "right" bit, as illustrated in the present exemplary embodiment. The left bit can represent a "0" or a "1" while the right bit can represent a "0" or a "1" independent of the left bit. However, the present invention is also suitable for use with other types of memory cells, such as those storing only a single bit, for example. Y-Paths 366a, 366b and 366c as shown in FIG. 3 and described below can be represented by Y-Path 166 as shown in FIG. 1B and described above.

Memory circuit 300 depicts a portion of a memory device including adjacent memory cells 305, 355 and 370 along the same word line 325 (designated "WL" in FIG. 3). In the particular embodiment depicted in FIG. 3, memory circuit 300 depicts an exemplary arrangement when a read operation involving left bit 382 of memory cell 305 is to be performed. Although not described herein for brevity, a similar memory circuit (not shown) can be implemented in accordance with the present invention when a read operation involving right bit 384 of memory cell 305 is to be performed. In the present application, memory cell 305, on which a read operation is to be performed, is also referred to as a "target cell" while each memory cell 355 and 370 adjacent to memory cell 305 is also referred to as a "neighboring cell."

In memory circuit 300, bit line 316 is configured as the "source" bit line (designated "S" in FIG. 3) of memory cell 305 by coupling node 317 to ground 365 through Y-Path 366a. Bit line 321 is configured as the "drain" bit line (designated "D" in FIG. 3) of memory cell 305 by connecting node 323 to node 320 through Y-Path 366b, where sensing circuit 360 is connected at node 320 (in the present application, the voltage supplied by sensing circuit 360 to node 323 through Y-Path 366b is also referred to as "drain" voltage). Word line 325 is connected to the gate terminal of memory cell 305 and is utilized to activate memory cell 305 during a read operation. In the present example, when memory cell 305 is activated, the amount of current 310 drawn by memory cell 305 indicates the "programmed" or "erase" status of left bit 382 of memory cell 305.

Continuing with FIG. 3, memory circuit 300 further comprises operational amplifier 381 having an output terminal connected to and driving node 350. Node 350 is also coupled to node 343 through Y-Path 366c so that bit line 341 of neighboring cell 355 is connected to the output terminal of operational amplifier 381 through Y-Path 366c. The noninverting input of operational amplifier 381 is coupled to node 320, and the inverting input of operational amplifier 381 is connected to its output terminal at node 350 through negative feedback loop 383. Bit line 351 of neighboring cell 370 is "floating" and may have a pattern-dependant path to ground through the neighboring memory cells. Operational amplifier 381 typically comprises a high-gain operational amplifier so that the voltage at its output terminal at node 350 is driven very close to the voltage at its noninverting input terminal at node 320. For example, the voltage difference between node 350 and node 320 may be reduced to about 5 mV. Furthermore, since node 343 is coupled to node 350 through Y-Path 366c and node 423 is coupled to node 320 through Y-Path 366b, the voltages at node 343 is also very close to the voltage at node 323. In effect, operational amplifier 381 configures bit line 341 of memory cell 355 as a "precharge" bit line (designated "P" in FIG. 3) by providing at node 343 a voltage that is very close to the voltage at node 323.

As a result of the particular arrangement of memory circuit 300 wherein the voltages at nodes 323 and 343 are very close, leakage current 335 through memory cell 355, i.e., from node 343 to node 323, is substantially reduced. For example, compared to known circuit 200, memory circuit 300 results in a significant reduction in leakage current 335, e.g., leakage current 335 being reduced from about 5 $\mu$A in the embodiment shown in FIG. 2 to approximately 2 $\mu$A in the present exemplary embodiment. With the magnitude of leakage current 335 being reduced significantly in memory circuit 300, total current 330 sensed by sensing circuit 360 is significantly less affected by leakage current 335 when target cell 305 is an erased cell and neighboring cell 355 is an erased or over-erased cell, and, therefore, the read margin loss is also reduced. Moreover, total current 330 detected by sensing circuit 360 more accurately represents current 310 drawn by left bit 382 of target cell 305 during a read operation, and thus the state of left bit 382 of target cell 305 can be more accurately determined.

Figure 4:
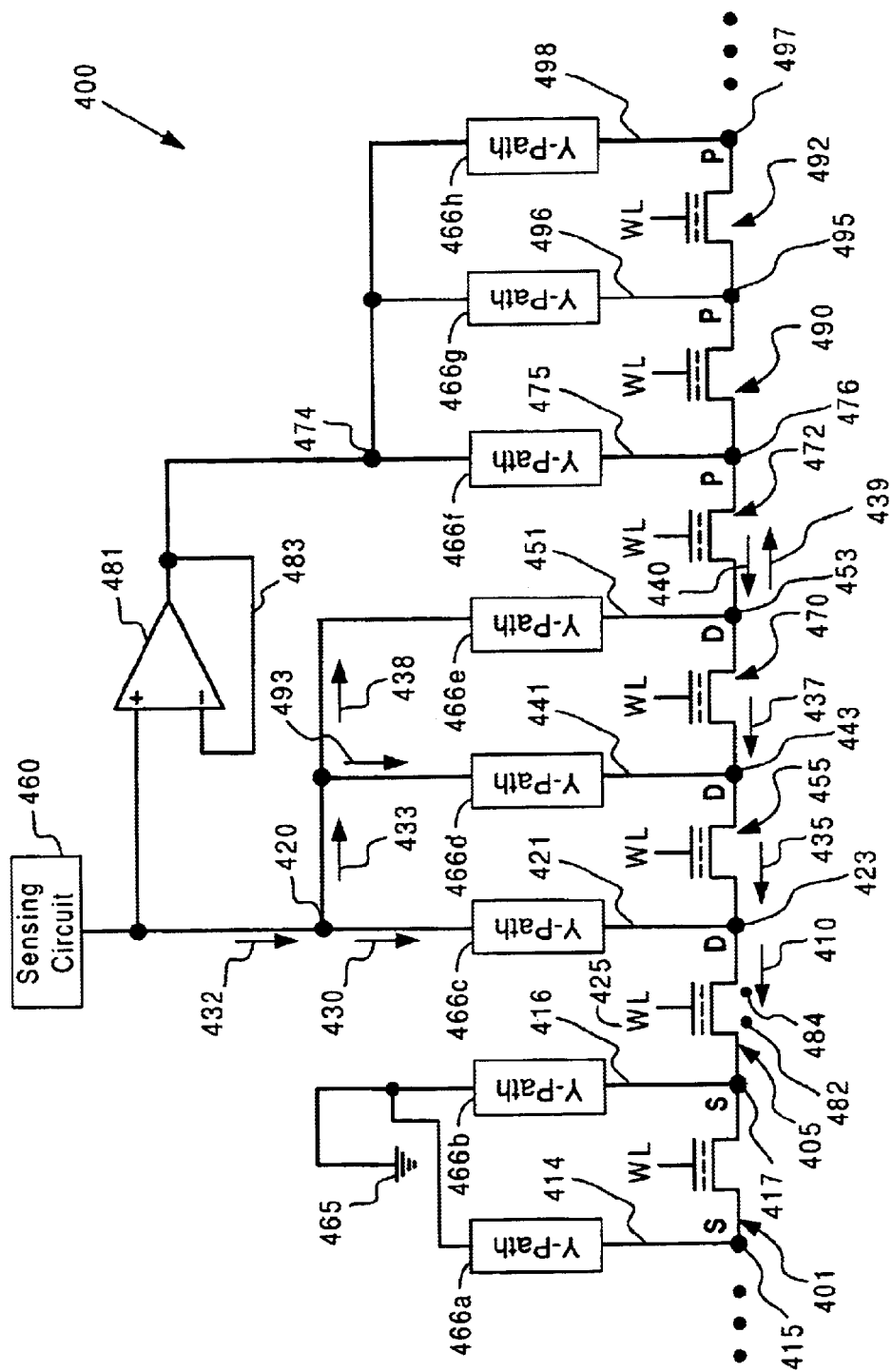
FIG. 4 depicts a circuit diagram of another embodiment of a memory circuit in accordance with the present invention.

Referring now to FIG. 4, there is shown a circuit diagram of another embodiment of the invention as memory circuit 400. Memory circuit 400 depicts a portion of a memory device including adjacent memory cells 401, 405, 455, 470, 472, 490 and 492 along the same word line (designated "WL" in FIG. 4) 425. The particular embodiment shown in FIG. 4 depicts an exemplary arrangement when a read operation involving left bit 482 of memory cell 405 is to be performed. A similar memory circuit (not shown) can be implemented in accordance with the present invention when a read operation involving right bit 484 of memory cell 405 is to be performed. In the present application, memory cell 405, on which a read operation is to be performed, can be referred to as a "target cell" while each memory cell 401, 455, 470, 472, 490 and 492 adjacent to memory cell 405 can be referred to as a "neighboring cell." Y-Paths 466a, 466b, 466c, 466d, 466e, 466f, 466g and 466h as shown in FIG. 4 and described below can be represented by Y-Path 166 as shown in FIG. 1B and described above.

In memory circuit 400, bit line 416 is configured as the "source" bit line (designated "S" in FIG. 4) of memory cell 405 by coupling node 417 to ground 465 through Y-Path 466b. Similarly, bit line 414 of neighboring memory cell 401 is also configured as a source bit line (memory cell 401 shares bit line 416 with memory cell 405). Thus, node 415 is coupled to ground 465 through Y-Path 466a. Bit line 421 is configured as the "drain" bit line (designated "D" in FIG. 4) of memory cell 405 by connecting node 423 to node 420 through Y-Path 466c, where node 420 is connected to sensing circuit 460 (in the present application, the voltage supplied by sensing circuit 460 to node 423 through Y-Path 466b is also referred to as "drain" voltage). Word line 425 is connected to the gate terminal of memory cell 405 and is utilized to activate memory cell 405 during a read operation. In the present example, when memory cell 405 is activated, the amount of current 410 drawn by memory cell 405 indicates the "programmed" or "erased" status of memory left bit 482 of memory cell 405.

In the particular embodiment depicted FIG. 4, bit lines 441 and 451 of memory cells 455 and 470, respectively, are configured as "drain" bit lines. As such, node 443 of bit line 441 and node 453 of bit line 451 are connected at node 420 to sensing circuit 460 through Y-Paths 466d and 466e, respectively. By further configuring bit lines 441 and 451 as "drain" bit lines in memory circuit 400, current 432 more accurately represents current 410 associated with left bit 482 of memory cell 405, and further results in reduced read margin loss, particularly when left bit 482 of memory cell 405 is an erased bit (corresponding to a "1" bit) and memory cells 455 and 470 are erased cells (each corresponding to a "1"). The reason is that current 433 is added to current 430 to form total current 432, thereby compensating for leakage current 435. Furthermore, current 438 is added to current 493 to form current 433, thereby compensating for leakage current 437. The magnitude of any additional leakage current through neighboring memory cells, e.g., current 440 through memory cell 472, is very small compared to current 410 drawn by left bit 382 of memory cell 405, and therefore, such additional leakage current has less of an impact on total current 432. Thus, total current 432 detected by sensing circuit 460 is very close to current 410 drawn by left bit 482 of memory cell 405 due to compensation for leakage currents 435 and 437. As a result, the read margin loss is significantly reduced. The recovery of the leakage current through this technique results in a significantly reduced read margin loss when sensing the state of left bit 482 of memory cell 405.

Continuing with reference to FIG. 4, memory circuit 400 further comprises operational amplifier 481 having an output terminal connected to and driving node 474. The noninverting input of operational amplifier 481 is coupled to node 420, and the inverting input of operational amplifier 481 is connected to its output terminal at node 474 through negative feedback loop 483. In the particular embodiment shown in FIG. 4, bit lines 475, 496 and 498 of memory cells 472, 490 and 492, respectively, are configured as "precharge" bit lines (designated "P" in FIG. 4) by connecting each of node 476 of bit line 475, node 495 of bit line 496, and node 497 of bit line 498 to the output terminal of operational amplifier 481 at node 474 through Y-Paths 466f, 466g and 466h, respectively.

Operational amplifier 481 typically comprises a high-gain operational amplifier so that the voltage at its output terminal at node 474 is driven very close to the voltage at its noninverting input terminal at node 420. As a further result of this arrangement, operational amplifier 481 provides, at each node 476, 495 and 497, a voltage that is very close to the voltage at node 453. With this configuration, leakage current 439 through memory cell 472 (i.e., from node 453 to node 476) is greatly reduced, particularly when left bit 482 of memory cell 405 is a programmed bit (corresponding to a "0" bit) and when memory cell 472 and all its neighboring cells between memory cell 472 and ground are erased cells (corresponding to a "1" bits), and/or when leakage current 439 is drawn through memory cell 472 due to transient current that could be present for charging some of the bit lines for memory cells situated on the right side of memory cell 492 in FIG. 4. Leakage current 439 is reduced because by providing additional precharge voltages to the right side of node 476, i.e., at nodes 495 and 497, node 476 is significantly less affected by the ground path and/or transient current path to the right side of node 497. In effect, the voltages at nodes 495 and 497 act to buffer the voltage at node 476 from the ground path and/or transient current path to the right side of node 497. Since node 476 is less affected by the ground path and/or transient current path to the right side of node 497, voltage at node 476 is close to the voltage at node 453.

As another feature of the invention, operational amplifier 481 further improves the accuracy of memory circuit 400 by further reducing leakage currents 439 and 440. As described above, operational amplifier 481 acts to drive the voltage at node 474 very close to the voltage at node 420. For example, the voltage difference between node 474 and node 420 may be reduced to about 5 mV. Since node 476 is coupled to node 474 through Y-Path 466f and node 453 is coupled to node 420 through Y-Path 466e, the voltage at node 476 is also brought very close to the voltage at node 453. Since the voltages at nodes 476 and 453 are very close together, leakage current 440 from node 476 to node 453 is even further reduced, thereby improving the accuracy of total current 432 when left bit 482 of memory cell is an erased bit and neighboring memory cells 455, 470, 472, 490, and 492 are erased cells. For example, compared to known circuit 200, memory circuit 400 results in a significant reduction in leakage current 440, e.g., leakage current 335 being reduced from about 5 $\mu$A in the embodiment shown in FIG. 2 to approximately 0.5 $\mu$A in the present exemplary embodiment. Likewise, since the voltages at nodes 476 and 453 are very close together, leakage current 439 from node 453 to node 476 is also further reduced, thereby improving the accuracy of total current 432 when left bit 482 of memory cell is a programmed bit and neighboring memory cells 455, 470, 472, 490, and 492 are erased cells. Significantly, the read margin loss is greatly reduced due to memory circuit 400 in either the case where left bit 482 of memory cell 405 is a programmed bit or an erased bit, even when neighboring memory cells 455, 470, 472, 490, and 492 are erased cells. Accordingly, comparison of current 432 against a reference current (not shown) can be made with greater accuracy and reliability during a read operation involving left bit 482 of memory cell 405. In sum, memory circuit 400 results in fast, accurate read memory operations with significantly reduced read margin loss.

As illustrated in the exemplary embodiment of FIG. 4, additional drain bit lines (e.g., bit lines 441 and 451)

configured for adjacent neighboring memory cells (e.g., memory cells 455 and 470) to the memory cell to be read (e.g., target cell 405) reduce the read margin loss when the bit of the memory cell to be read is an erased bit, and where bits associated with neighboring memory cells are erased bits. On the other hand, additional precharge bit lines (e.g., bit lines 496 and 498) configured for other adjacent neighboring memory cells (e.g., memory cells 490 and 492) reduce the read margin loss when the bit of the memory cell to be read is a programmed bit, and where bits associated with neighboring memory cells are erased bits. It is noted that this increased accuracy in the read memory operation due to additional drain and/or precharge bit lines is achieved at the expense of additional power consumption and access speed. Accordingly, in other embodiments of the present invention, the number of "drain" bit lines and/or "precharge" bit lines may be selected in accordance with a particular desired accuracy, power budget, and access speed.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. For example, the specific number of "drain" bit lines and "precharge" bit line can be modified without departing from the scope of the present invention, as noted above. Furthermore, it is manifest that although the particular embodiments shown in FIGS. 3 and 4 and describe above utilize drain-side sensing, i.e., where sensing circuitry is coupled to the drain bit line, the present invention can be modified to provide fast, accurate memory read operations where a source-side sensing approach is used, i.e., where sensing circuit is coupled to the source bit line, without departing form the scope and spirit of the invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, a circuit for fast and accurate memory read operations has been described.

What is claimed is:

1. A memory circuit for sensing current in a target cell during a read operation, said memory circuit comprising:
   said target cell having a first bit line connected to ground, said target cell having a second bit line connected to a drain voltage;
   a sensing circuit coupled at a first node to at least one of said first bit line or said second bit line;
   a first neighboring cell having a third bit line connected to a second node;
   an operational amplifier having an output terminal connected at said second node to said third bit line during said read operation, said operational amplifier having a noninverting input terminal connected to said first node, said operation amplifier having an inverting input terminal connected to said second node.

2. The memory circuit of claim 1, further comprising a second neighboring cell, said second neighboring cell having a fourth bit line coupled to said second node, said second neighboring cell adjacent to said first neighboring cell.

3. The memory circuit of claim 1, further comprising a second neighboring cell, said second neighboring cell having a fourth bit line coupled to said first node, said second neighboring cell adjacent to said target cell, said first neighboring cell adjacent to said second neighboring cell.

4. The memory circuit of claim 3, further comprising a third neighboring cell, said third neighboring cell having a fifth bit line coupled to said second node, said third neighboring cell adjacent to said first neighboring cell.

5. The memory circuit of claim 1, further comprising a second neighboring cell, said second neighboring cell having a fourth bit line coupled to said first node, said second neighboring cell adjacent to said target cell, said memory circuit further comprising a third neighboring cell, said third neighboring cell having a fifth bit line coupled to said first node, said third neighboring cell adjacent to said second neighboring cell, said first neighboring cell adjacent to said third neighboring cell.

6. The memory circuit of claim 5, further comprising a fourth neighboring cell, said fourth neighboring cell having a sixth bit line coupled to said second node, said fourth neighboring cell adjacent to said first neighboring cell.

7. The memory circuit of claim 6, further comprising a fifth neighboring cell, said fifth neighboring cell having a seventh bit line coupled to said second node, said fifth neighboring cell adjacent to said fourth neighboring cell.

8. The memory circuit of claim 7, wherein said sensing circuit is coupled to said second bit line, said memory circuit further comprising a sixth neighboring cell, said sixth neighboring cell having an eighth bit line coupled to said ground, said sixth neighboring cell adjacent to said target cell.

9. The memory circuit of claim 1, wherein each of said target cell and said first neighboring cell comprises a respective gate terminal connected to a common word line.

10. The memory circuit of claim 1, wherein said target cell stores a first bit and a second bit.

11. A memory circuit comprising:
    target cell means for storing at least one bit, said target cell means having a first bit line connected to ground, said target cell means having a second bit line connected to a drain voltage;
    sensing circuit means for sensing current in said target cell means during a read operation, said sensing circuit means coupled at a first node to at least one of said first bit line or said second bit line;
    first neighboring cell means for storing at least one bit, said first neighboring cell means having a third bit line connected to a second node;
    operational amplifier means having an output terminal connected at said second node to said third bit line during said read operation, said operational amplifier means having a noninverting input terminal connected to said first node, said operation amplifier means having an inverting input terminal connected to said second node.

12. The memory circuit of claim 11, further comprising second neighboring cell means for storing at least one bit, said second neighboring cell means having a fourth bit line coupled to said first node, said second neighboring cell means adjacent to said target cell, said first neighboring cell adjacent to said second neighboring cell.

13. The memory circuit of claim 12, further comprising third neighboring cell means for storing at least one bit, said third neighboring cell means having a fifth bit line coupled to said second node, said third neighboring cell means adjacent to said first neighboring cell means.

14. The memory circuit of claim 11, further comprising second neighboring cell means for storing at least one bit, said second neighboring cell means having a fourth bit line coupled to said first node, said second neighboring cell means adjacent to said target cell, said memory circuit further comprising third neighboring cell means for storing at least one bit, said third neighboring cell means having a fifth bit line coupled to said first node, said third neighboring cell means adjacent to said second neighboring cell, said first neighboring cell adjacent to said third neighboring cell.

15. The memory circuit of claim 14, further comprising fourth neighboring cell means for storing at least one bit, said fourth neighboring cell means having a sixth bit line coupled to said second node, said fourth neighboring cell means adjacent to said first neighboring cell, said memory circuit further comprising fifth neighboring cell means for storing at least one bit, said fifth neighboring cell means having a seventh bit line coupled to said second node, said fifth neighboring cell means adjacent to said fourth neighboring cell means.

16. The memory circuit of claim 11, wherein each of said target cell means and said first neighboring cell means comprises a respective gate terminal connected to a common word line.

17. A memory circuit for sensing current in a target cell during a read operation, said memory circuit comprising said target cell having a first bit line connected to ground, said target cell having a second bit line connected to a drain voltage, said memory circuit further comprising a sensing circuit coupled at a first node to at least one of said first bit line or said second bit line; said memory circuit further comprising a first neighboring cell having a third bit line connected to a second node, said memory circuit being characterized by:

an operational amplifier having an output terminal connected at said second node to said third bit line during said read operation, said operational amplifier having a noninverting input terminal connected to said first node, said operation amplifier having an inverting input terminal connected to said second node.

18. The memory circuit of claim 17, further comprising a second neighboring cell, said second neighboring cell having a fourth bit line coupled to said first node, said second neighboring cell adjacent to said target cell, said first neighboring cell adjacent to said second neighboring cell.

19. The memory circuit of claim 18, further comprising a third neighboring cell, said third neighboring cell having a fifth bit line coupled to said second node, said third neighboring cell adjacent to said first neighboring cell.

20. The memory circuit of claim 17, wherein each of said target cell and said first neighboring cell comprises a respective gate terminal connected to a common word line.

* * * * *